(12) United States Patent
Nakamura et al.

(10) Patent No.: US 8,980,748 B2
(45) Date of Patent: Mar. 17, 2015

(54) SUBSTRATE POLISHING METHOD, SEMICONDUCTOR DEVICE AND FABRICATION METHOD THEREFOR

(75) Inventors: Hiroko Nakamura, Kanagawa (JP); Takaaki Kozuki, Kanangawa (JP); Takayuki Enomoto, Nagasaki (JP); Yuichi Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 1691 days.

(21) Appl. No.: 12/003,890

(22) Filed: Jan. 3, 2008

(65) Prior Publication Data
US 2008/0197456 A1 Aug. 21, 2008

(30) Foreign Application Priority Data

Feb. 16, 2007 (JP) ................................ 2007-036621

(51) Int. Cl.
*H01L 21/302* (2006.01)
*H01L 21/3105* (2006.01)
*C09G 1/02* (2006.01)
*H01L 27/108* (2006.01)

(52) U.S. Cl.
CPC ............ *H01L 21/31053* (2013.01); *C09G 1/02* (2013.01); *H01L 27/10894* (2013.01)
USPC ........... 438/691; 438/693; 438/697; 438/700; 257/E21.219; 257/E21.244; 257/E21.214

(58) Field of Classification Search
USPC .......... 438/691, 693, 697, 700; 257/E21.219, 257/E21.244, E21.214
See application file for complete search history.

(56) References Cited

U.S. PATENT DOCUMENTS

| 5,532,194 | A  | * | 7/1996 | Kawashima et al. | 501/9 |
| 6,238,450 | B1 | * | 5/2001 | Garg et al. | 51/309 |
| 2002/0132492 | A1 | * | 9/2002 | Kim et al. | 438/758 |
| 2004/0235396 | A1 | * | 11/2004 | Hattori et al. | 451/41 |
| 2005/0164519 | A1 | * | 7/2005 | Katz | 438/778 |
| 2006/0032149 | A1 | * | 2/2006 | Kim et al. | 51/307 |
| 2007/0054494 | A1 | * | 3/2007 | Chen et al. | 438/690 |

FOREIGN PATENT DOCUMENTS

| JP | 11-135617 | | 5/1999 |
| JP | 11135617 | A * | 5/1999 |
| JP | 2004-168638 | | 6/2004 |
| JP | 2004-349426 | | 12/2004 |
| JP | 2005-203394 | | 7/2005 |
| JP | 2007-227808 | | 9/2007 |

OTHER PUBLICATIONS

Japanese Office Action issued Oct. 7, 2008 for corresponding Japanese Application No. 2007-036621.

* cited by examiner

*Primary Examiner* — Michael Jung
*Assistant Examiner* — John P Dulka
(74) *Attorney, Agent, or Firm* — Rader, Fishman & Grauer PLLC

(57) ABSTRACT

A substrate polishing method, a semiconductor device and a fabrication method for a semiconductor device are disclosed by which high planarization polishing can be achieved. In the substrate polishing method, two or more different slurries formed from ceria abrasive grains having different BET values from each other are used to carry out two or more stages of chemical-mechanical polishing processing of a polishing object oxide film on a substrate to flatten the polishing object film.

3 Claims, 4 Drawing Sheets

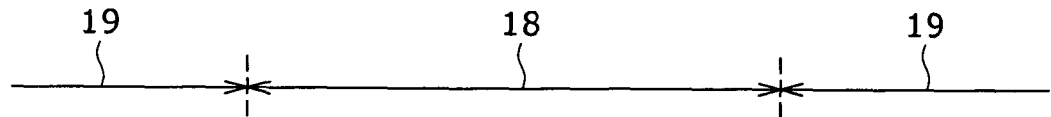
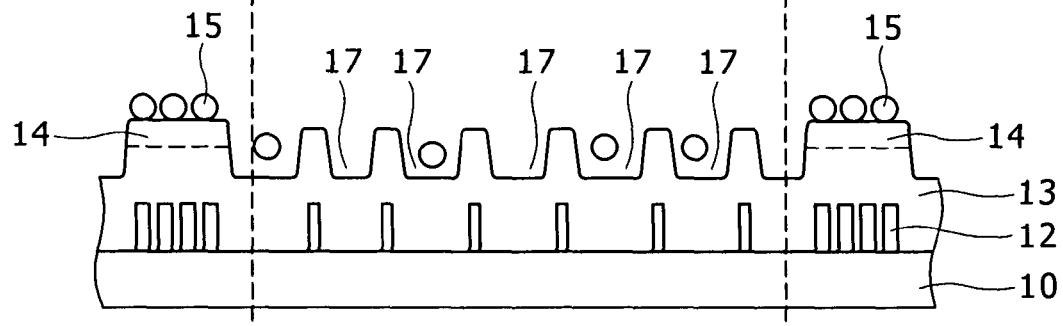
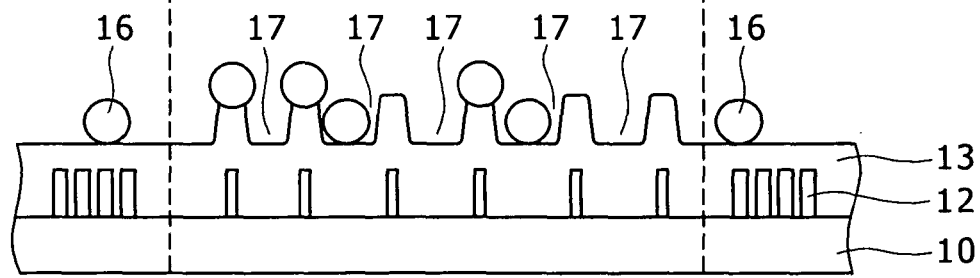
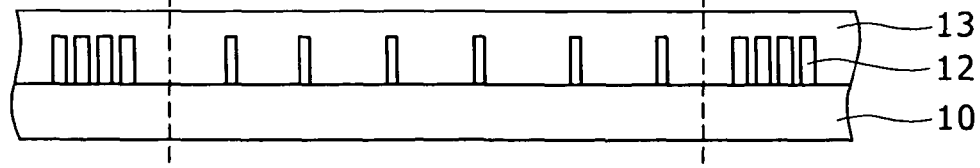

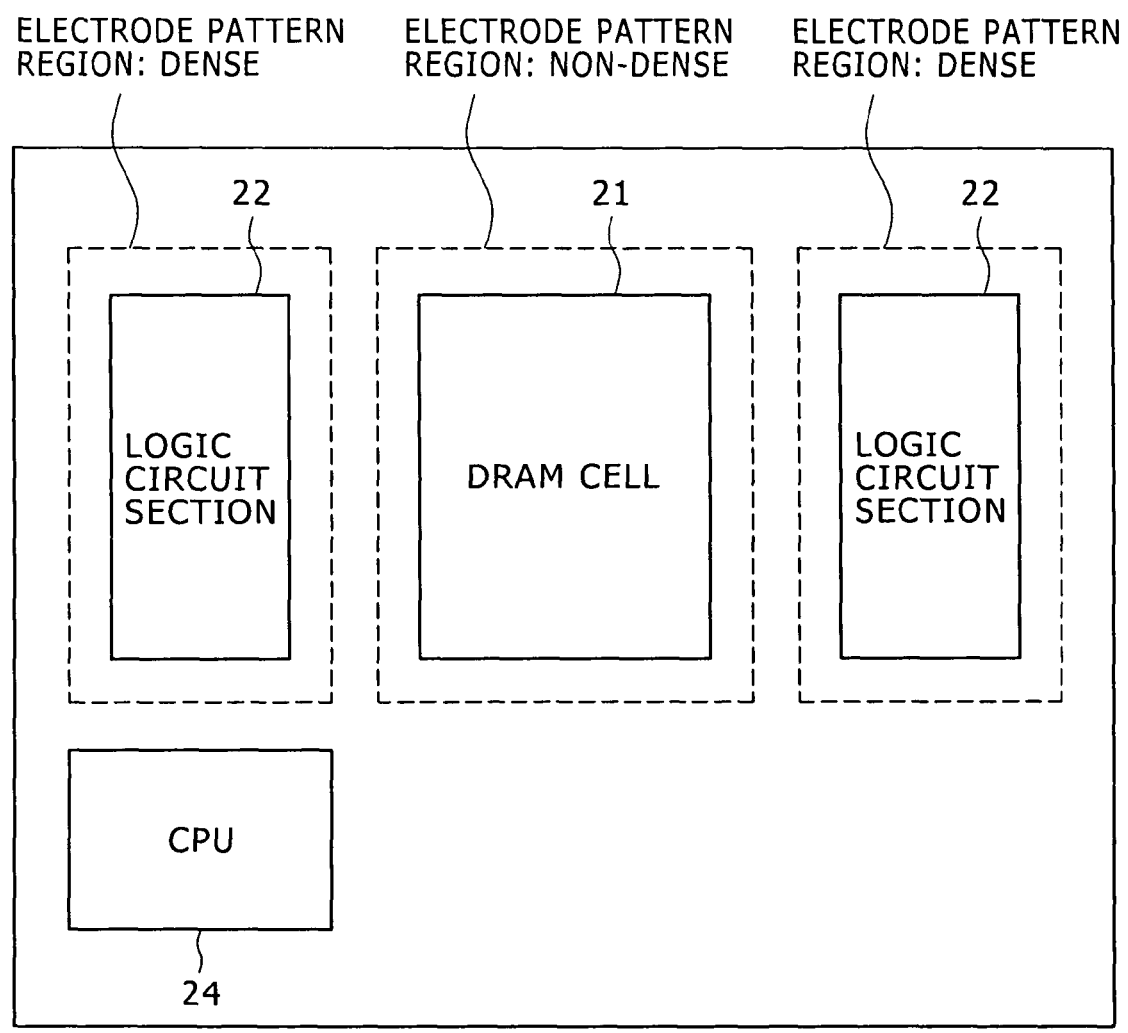

SUBSTRATE POLISHING METHOD, SEMICONDUCTOR DEVICE AND FABRICATION METHOD THEREFOR

CROSS REFERENCES TO RELATED APPLICATIONS

The present invention contains subject matter related to Japanese Patent Application JP 2007-036621 filed in the Japan Patent Office on Feb. 16, 2007, the entire contents of which are incorporated herein by reference.

BACKGROUND OF THE INVENTION

1. Field of the Invention

This invention relates to a substrate polishing method, and more particularly, to a substrate polishing method applied to flattening polishing of a polishing object in the form of a thin plate, such as a liquid crystal panel substrate.

The present invention also relates to a semiconductor device fabricated by applying the substrate polishing method and a fabrication method for the semiconductor device.

2. Description of the Related Art

In related art, a colloidal suspension, wherein silicon nitride or a hydrate of silicon nitride is dispersed colloidally or colloidal silica, is used as a polishing agent, that is, as a polishing composition (hereinafter referred to as slurry) for polishing the surface of a semiconductor substrate (hereinafter referred to as wafer) formed from a silicon wafer, a chemical wafer or the like. Further, as a polishing method, chemical mechanical polishing (CMP) is generally known wherein a wafer is placed on a polishing surface table on which a polishing cloth formed from a foamed member, a synthetic resin (polyurethane or the like) or an unwoven fabric is stretched and, while the wafer is pressed and rotated by a polishing head, the slurry is supplied quantitatively to the wafer to carry out polishing.

As the slurry, a solution produced by cracking silicon particles in the form of fine colloidal silica into a solution which contains an alkali component is used as disclosed, for example, in U.S. Pat. No. 3,328,141. This polishing applies a chemical action of an alkali component of a slurry, particularly an erosion action for a wafer or the like. In particular, by the erosion action of alkali, a thin and soft erosion layer is formed on the surface of a wafer or the like, and the thin layer is successively removed by the mechanical action of fine colloidal silicon particles to advance polishing.

Meanwhile, a polishing method for improving the flatness of an element isolation portion without an increase of the number of steps in trench element isolation formation by CMP is disclosed in Japanese Patent Laid-Open No. Hei 11-135617. According to the polishing method, a slurry formed from abrasive grains of a comparatively large particle size is used in the front half of polishing whereas another slurry formed from abrasive grains of a comparatively small particle size is used in the latter half to carry out polishing. Such polishing provides an effect that the polishing time is reduced by the polishing using abrasive grains of the comparatively large particle size and the flatness is improved by the polishing using abrasive grains of the comparatively small particle size.

SUMMARY OF THE INVENTION

In recent years, together with the refinement and enhancement of the accuracy of elements in semiconductor devices in a semiconductor fabrication process, the achievement of high flattening or planarization is demanded (that a result of polishing exhibits little concave and convex offsets). To this end, a ceria slurry which contains a surface-active agent which has a protective action for a polishing object film and allows concentrated polishing for convex portions of the polishing object film is used. In the ceria slurry which contains the surface-active agent, ceria particles are disposed in such a manner as to surround the surface-active agent. Since the ceria particles exist around the surface-active agent, when a polishing object film is polished, the pressure acts concentratedly on the abrasive particles existing at a portion of the polishing object face which protrudes from its surface. Consequently, the ceria particles are broken, the surface-active agent in the ceria particles are desorbed, and the polishing at the portion progresses. By using such a ceria slurry in which the surface-active agent is used as just described, the protective action for the polishing an object film by the surface-active agent increases in the proximity of the end of the polishing, resulting in an increase of the frictional force exerted between the polishing head and the polishing object film. The slurry and so forth agglomerating in this state cause scratches and so forth, and in the worst case, internal wiring lines of the wafer are damaged. In this manner, the yield is deteriorated significantly.

Further, where the results from when the ceria slurry is used and when the silica slurry in the preceding generation is used are compared with each other, while high planarization is obtained by the use of the ceria slurry, the polishing amount is small, that is, the polishing rate is low, and the polishing object film may not be planed sufficiently.

Further, if fine patterns formed in an underlying layer have some density variation, then the wafer in-plane distribution of the polishing object film is degraded, that is, some density variation appears also in the distribution of concaves and convexes of the surface of the wafer. For example, where a semiconductor device wherein MOS transistors are integrated has a region within which gate electrodes are formed densely and another region within which gate electrodes are formed non-densely, an insulating film formed on the gate electrodes is influenced by the density of the gate electrodes and forms concaves and convexes which have a density variation on the surface thereof. Although a CMP process is applied after the insulating film is formed, it is carried out following up the concaves and the convexes having the density variation, and a desired high planarization may not be achieved. Therefore, the CMP results in insufficiently high planarization, and the remaining offsets of the concaves and convexes disable satisfactory focusing at a succeeding exposure step, resulting in the failure in exposure of a pattern for formation of desired wiring lines on the wafer. This gives rise to a significant drop of the yield.

In such a CMP process in related art, for a wafer having a density variation on the surface thereof, for example, by a density variation of gate electrodes, a method in which an inverted mask is used or a like method is used in order to achieve higher planarization. The inverted mask is used at a step preceding CMP processing to selectively etch an insulating film formed on electrode patterns of a high density using a reactive ion etching (RIE) method while a portion of the insulating film which is covered with the inverted mask may not be etched. Since this makes the density variation of concaves and convexes of the surface of the insulating film uniform, a higher planarization face can be obtained at the succeeding CMP processing step. However, use of the method in which such an inverted mask is used needs an increased number of steps and gives rise to an increase of the cost.

Therefore, a substrate polishing method, a semiconductor device and a fabrication method for a semiconductor device by which high planarization polishing can be achieved is demanded.

According to an embodiment of the present invention, there is provided a substrate polishing method comprising a step of carrying out, using two or more different slurries formed from ceria abrasive grains having different BET values from each other, two or more stages of chemical-mechanical polishing processing of a polishing object oxide film on a substrate to flatten the polishing object film.

In the substrate polishing method, since the polishing object oxide film is polished successively using two or more different slurries formed from ceria abrasive grains having different BET values, different portions of the polishing object oxide film are successively polished concentratedly at the different stages based on the variation of density of underlying layer patterns.

With the substrate polishing method, since different portions of the polishing object oxide film are successively polished concentratedly at the different stages based on the variation of density of underlying layer patterns, a high planarization face can be obtained on the oxide film.

According to another embodiment of the present invention, there is provided a semiconductor device comprising an interlayer oxide film having a surface formed as a flattened face by polishing using a slurry formed from ceria abrasive grains having a first BET value and polishing using another slurry formed from ceria abrasive grains having a second BET value lower than the first BET film.

In the semiconductor device, since the surface of the interlayer oxide film is polished into a high planarization face, an overlying layer pattern of a high degree of accuracy is formed on the interlayer insulating film.

With the semiconductor device, since an overlying layer pattern of a high degree of accuracy is formed on the interlayer oxide film polished so as to have a high planarization face, an enhancement of the reliability is achieved.

According to a further embodiment of the present invention, there is provided a fabrication method for a semiconductor device comprising a step of carrying out using two or more different slurries formed from ceria abrasive grains having different BET values from each other, two or more stages of chemical-mechanical polishing processing of a polishing object oxide film on a substrate to flatten the polishing object film.

In the fabrication method for a semiconductor device, since the polishing object oxide film is polished successively using two or more different slurries formed from ceria abrasive grains having different BET values, different portions of the polishing object oxide film are successively polished concentratedly at the different stages based on the variation of density of underlying layer patterns.

With the fabrication method for a semiconductor device, since different portions of the polishing object oxide film are successively polished concentratedly at the different stages based on the variation of density of underlying layer patterns, a high planarization face can be obtained on the oxide film.

The above and other features and advantages of the present invention will become apparent from the following description and the appended claims, taken in conjunction with the accompanying drawings in which like parts or elements are denoted by like reference symbols.

BRIEF DESCRIPTION OF THE DRAWINGS

FIGS. 4A, 4B and 4C are schematic views illustrating different steps of the oxide film CMP method; and FIG. 5 is a schematic view showing a DRAM-mixed logic circuit as an example of a wafer to which a substrate polishing method according to the present invention is applied.

DETAILED DESCRIPTION OF THE PREFERRED EMBODIMENT

Figure 1:
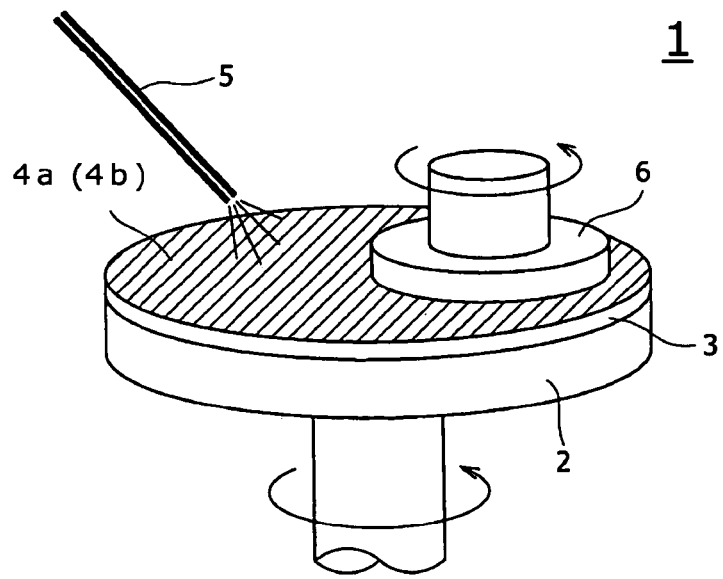
FIG. 1 is a perspective view showing a CMP apparatus used for an oxide film CMP method to which the present invention is applied.

FIG. 1 shows a general configuration of a polishing apparatus, that is, a CMP apparatus, which is applied to a substrate polishing method according to the present invention. The CMP apparatus is applied to the fabrication of semiconductor devices. Referring to FIG. 1, the CMP apparatus 1 shown is used for CMP processing and includes a surface table 2 having a polishing pad 3 placed on an upper face thereof, a polishing head 6 disposed in an opposing relationship to the surface table 2, and a slurry supplying section 5 for supplying slurries 4a and 4b to the surface of the polishing pad 3.

The polishing pad 3 may be, for example, a foamed member of a synthetic resin (such as polyurethane) or an abrasive cloth formed from unwoven cloth.

In a CMP process in which the CMP apparatus of the present embodiment is used, a semiconductor substrate (hereinafter referred to as wafer) (not shown) which may be a silicon wafer, a compound wafer or the like is placed on the surface table 2 on which the polishing pad 3 is stretched. Then, while slurries 4a and 4b are supplied quantitatively from the slurry supplying section 5, the polishing head 6 is pressed against the wafer, and the surface table 2 and the polishing head 6 are rotated individually at a predetermined speed in the same direction (in directions indicated by arrow marks) to carry out polishing. In the present embodiment, the speed of rotation of the polishing head 6 is, for example, 107 rpm, and the speed of rotation of the surface table 2 is, for example, 100 rpm. For the slurry 4 serving as an abrasive, a suspension in which cerium dioxide and hydrate of cerium dioxide are dispersed in a colloidal form is used.

Figure 2:
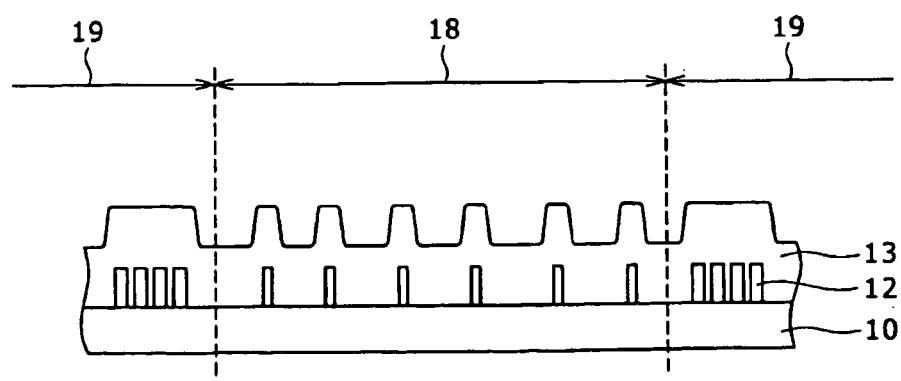
FIG. 2 is a schematic sectional view of a wafer having a polishing object film to be polished by the oxide film CMP method.

FIG. 2 shows a general sectional configuration of a substrate polished by the CMP apparatus of FIG. 1, that is, a wafer having an oxide film to be polished.

Referring to FIG. 2, an oxide film 13 to be polished flatly, that is, a polishing object oxide film 13, is formed on the wafer 10. The oxide film 13 has a region 18 within which lower layer patterns are non-dense and regions 19 within which the lower layer patterns are dense, and the oxide film 13 is formed on the lower layer patterns. In the present embodiment, the lower layer patterns are gate electrode patterns, and the oxide film 13 is an interlayer oxide film.

Where the area ratio of the electrode patterns formed from gate electrodes 12 has a variation on one wafer 10 in this manner, some influence of the area ratio appears also on the surface of the workpiece. In particular, since the area ratio of the electrode patterns has a variation, the in-plane distribution of concaves and convexes on the surface of the oxide film 13 of an upper layer shown in FIG. 2 is deteriorated. Therefore, upon flattening by a CMP process, in related art, the surface of the oxide film 13 is not flattened well because of the variation of the density of concaves and convexes.

Therefore, in the substrate polishing method according to the present embodiment, ceria abrasive grains having different BET (Brunaure Emmet Teller) values (particle sizes) are used as slurries to perform a CMP process in response to the density of electrode patterns to polish a polishing object film having a varying density. The BET value is a specific surface area per unit weight (1 g) and is represented in a unit of m²/g. In particular, the BET value and the particle size have a relationship that, when the BET value is high, the particle size is small, but when the BET value is low, the particle size is great.

Figure 3A:
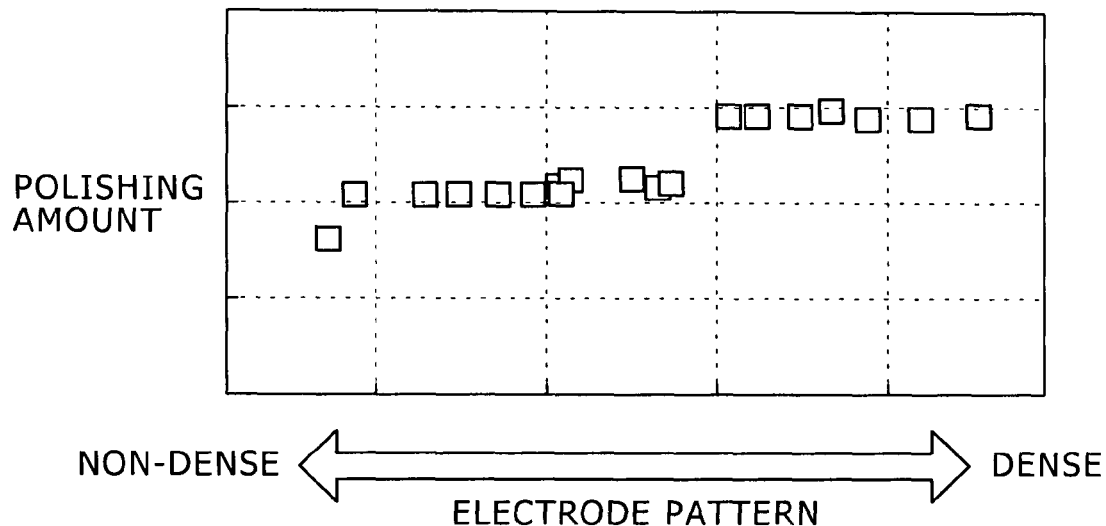
FIGS. 3A and 3B are views illustrating the polishing amount with respect to the area ratio of wiring line patterns when the BET value is high and the polishing amount with respect to the area ratio of wiring line patterns when the BET value is low, respectively.
Figure 3B:
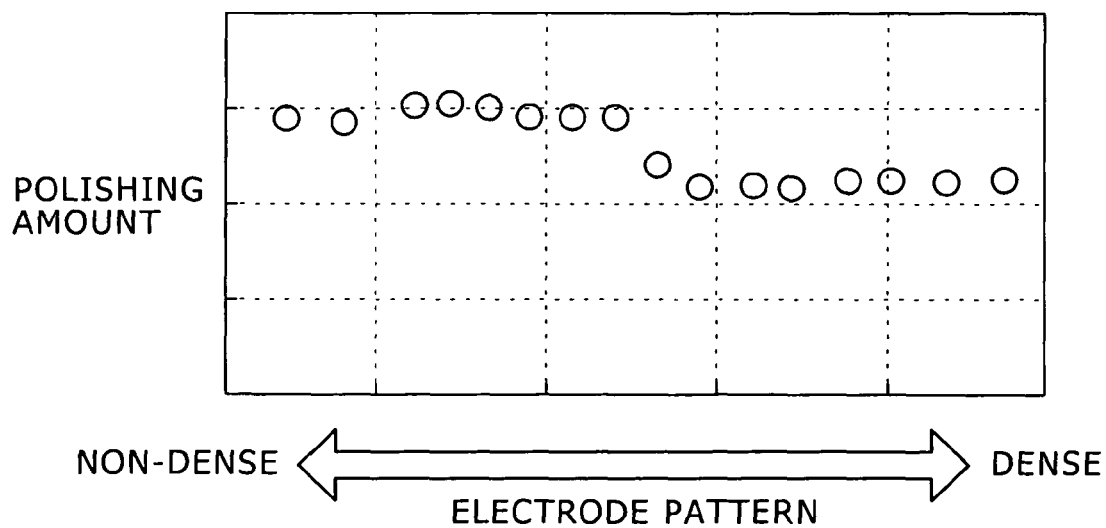

FIG. 3A illustrates the polishing amount with respect to the density of electrode patterns where the BET value is high, that is, where the particle size of the ceria abrasive grain is small. Meanwhile, FIG. 3B illustrates the polishing amount with respect to the density of electrode patterns where the BET value is low, that is, where the particle size of the ceria abrasive grain is small.

In a ceria slurry from which the surface-active agent is removed, where the BET value is high, the polishing amount where the area ratio of electrode patterns is high, that is, in the regions 19 within which electrode patterns exist densely, is great. However, where the BET value is low, the polishing amount where the area ratio of electrode patterns is low, that is, in the region 18 within which electrode patterns exist non-densely. In this manner, where the BET value or particle size varies, the polishing amount varies depending upon the density of electrode patterns. In the present embodiment, such a characteristic as just described is made the most of so as to apply a CMP process to a wafer which has a variation in density of concaves and convexes on the surface of an oxide film.

FIGS. 4A, 4B and 4C illustrate the polishing method according to the present embodiment. In particular, FIGS. 4A to 4C schematically illustrate a process wherein two ceria slurries having different BET values are used to carry out two-stage polishing. A wafer 10 having a polishing object film shown in FIGS. 4A to 4C corresponds to the surface table 2 described hereinabove with reference to FIG. 2.

On the wafer 10 having the oxide film 13 as a polishing object film, gate electrodes 12 are formed densely within the opposite end regions 19 within which electrode patterns exist densely, but they are formed non-densely within a central region 18. In this manner, the gate electrodes 12 on the wafer 10 are distributed in varying densities. Further, within the regions 19 within which the electrode patterns exist densely, since the oxide film 13 formed as a polishing object film on the electrode patterns fills up gaps between the gate electrodes 12 formed densely, no groove is formed and the surface of the oxide film 13 is formed in a flush state. On the other hand, within the region '18 within which electrode patterns exist non-densely, since the oxide film 13 forms concaves and convexes in accordance with electrode patterns in the region 18, grooves 17 are formed on the surface of the polishing object face. Such a wafer 10 as just described is placed on the polishing pad 3 of the surface table 2 of the CMP apparatus 1 described hereinabove with reference to FIG. 1, and the slurries 4a and 4b are successively supplied from the slurry supplying section 5, thereby to carry out a two-stage CMP process. In particular, in an apparatus which includes one surface table and one slurry supplying pipe, first stage polishing, post-cleaning of the wafer, unloading, second stage polishing, post-cleaning of the wafer and unloading are performed in this order. In an alternative apparatus which includes a plurality of surface tables and a plurality of slurry supplying pipes, the different first and second state polishing operations are performed using different ones of the surface tables and slurry supplying pipes.

First, the slurry 4a 4-having ceria abrasive grains 15 of a BET value of approximately 15 to 30 m²/g (average particle size of 170 to 140 nm) is supplied at the first stage, as seen in FIG. 4A.

At this time, since little grooves exist on the surface of the oxide film 13 on the electrode patterns on which the gate electrodes 12 are formed densely while grooves 17 are formed on the surface of the oxide film 13 on the electrode patterns on which the gate electrodes 12 are formed non-densely, the ceria abrasive grains 15 supplied to the surface of the oxide film 13 on the electrode patterns on which the gate electrodes 12 are formed non-densely enter the grooves 17 because they have a small particle size. In other words, the ceria abrasive grains 15 used at the first stage have such a particle size that they are admitted into the grooves 17 of the uneven surface within the region 18 within which the gate electrodes 12 are non-dense. On the other hand, since the surface of the oxide film 13 within the regions 19 within which the gate electrodes 12 are formed densely has little grooves 17 into which the ceria abrasive grains 15 can be admitted, the ceria abrasive grains 15 remain on the surface of the oxide film 13. Consequently, the ceria abrasive grains 15 exist on the oxide film 13 within the regions 19 within which the gate electrodes 12 are formed densely. In such a state as just described, the polishing head 6 is pressed on the wafer 10 having the oxide film 13 and the polishing head 6 and the surface table 2 are rotated. Consequently, an oxide film 14 within the region 18 within which the gate electrodes 12 are formed densely is polished to flatten the oxide film 14.

Then, the ceria slurry 4b having ceria abrasive grains 16 of a BET value of approximately 5 to 10 m²/g (average particle size of 265 to 170 nm) lower than the BET value at the first stage is supplied from the slurry supplying section 5.

The BET value of the ceria slurry 4b used at the second stage is higher than the BET value of the ceria slurry in related art. In other words, the particle size of the ceria abrasive grains 16 used at the second stage is greater than the particle size of the ceria abrasive grains 15 used at the first stage. Consequently, convexes of the uneven surface of the oxide film 13 within the region 18 within which the lower layer patterns exist non-densely and within which the flattening was not performed at the first stage are polished intensively. While the wafer 10 is pressed by the polishing head 6 upon polishing, since the pressure applied at this time to the convex portions is higher than the pressure applied to the concave portions, the convex portions are polished intensively.

By the two-stage polishing described above, the oxide film 13 on the surface of the wafer is flattened, as seen in FIG. 4C.

In this manner, the surface of the oxide film 13 within the regions 18 and 19 which exhibit different densities of electrode patterns is flattened uniformly without being influenced by the density of electrode patterns. Therefore, the wiring accuracy at a wiring step, which is an example of a next step and at which wiring lines are formed on the oxide film, can be improved.

Ceria slurries in related art, where concave and convex offsets are to be flattened, when convex portions are polished, since the polishing also advances with the concave portions although the polishing rate is lower than that with the convex portions, the area ratio of the patterns 12 influences much upon the flattening. Consequently, flattening takes a lot of time.

In the present embodiment, by using two different ceria slurries for the different stages, the face of the lower layer patterns which has the varying density can be polished efficiently. Further, while ceria slurries used in related art have a BET value of approximately 20 m²/g and an average particle size of approximately 170 nm, in the present embodiment, a slurry having a BET value lower (having a particle size smaller) than the BET value of the ceria slurries in related art is used at the first stage to polish convex portions having a high area ratio of the patterns. Then, at the second stage, a ceria slurry having a BET value smaller (having a particle size greater) in average than that of the slurries in related art is used to polish the convex portions which have a lower area ratio of the patterns to achieve flattening.

By using two ceria slurries having different BET values from each other to carry out two-stage polishing, as in the present embodiment, even where the in-plane uniformity of a polishing object film is low, polishing which can achieve a high planarization can be implemented. Therefore, a high planarization over a wide range can be achieved. Further, since the need for such selective etching in which an inverted mask is used is eliminated, the cost can be suppressed without an increase of the number of steps.

Further, according to the present embodiment, since no surface-active agent is used for the ceria slurries, the frictional force during polishing is suppressed from that in an alternative CPM processing process wherein a surface-active agent is used and a reduction of scratches is anticipated. Further, since the polishing rate is higher than that by a CMP processing process wherein a surface-active agent is used and suppression of the polishing amount can be carried out more readily, a reduction of the running cost and an improvement of the throughput can be anticipated.

In the present embodiment, while no surface-active agent is added to the ceria slurries, it may be added otherwise to such a degree that the polishing characteristic is not varied very much. At this time, preferably, the amount of the surface-active agent to be added at the first stage is smaller than 10 cc/min and the amount of the surface-active agent to be added at the second stage is smaller than 5 cc/min. When the amounts of the surface-active agents are such as given above, a result similar to that achieved where such a surface-active agent as described above is not added is achieved.

Further, while a two-stage process is used in the present embodiment, a more-than-two-stage process may be used such that the different ceria slurries are successively supplied to a wafer in the ascending order of the BET value to polish a polishing object oxide film.

Furthermore, while in the present embodiment a single slurry supplying pipe is used, two slurry supplying pipes may be used to supply different ceria slurries from the different pipes.

A semiconductor device fabricated through the flattening process described above has a configuration in which the face of the oxide film 13 is flattened into a high planarization face and wiring lines of a high degree of accuracy are formed on the flattened face of the oxide film 13. Therefore, the reliability as a semiconductor device can be improved.

The substrate polishing method of the present invention described above can be applied to the fabrication of a semiconductor device, for example, a DRAM-mixed logic circuit. FIG. 5 shows a general configuration of a DRAM-mixed logic circuit. Referring to FIG. 5, the DRAM-mixed logic circuit 20 is a semiconductor device which includes CMOS logic circuit sections (hereinafter referred to as logic circuit sections) 22, a DRAM cell 21 formed from MOS transistors and capacitors, and a CPU 24. The logic circuit sections 22, the DRAM cell 21 and the CPU 24 are formed on a board 23.

In the DRAM-mixed logic circuit 20, a plurality of gate electrodes 12 are formed on the wafer 10 made of Si, as seen in FIG. 2, with a gate insulating film (not shown) therebetween, and an oxide film 13 which is an insulating film is deposited on the overall area of an upper face of the wafer 10 in such a manner as to embed the gate electrodes 12. Then, in such a DRAM-mixed logic circuit 20 as just described, a number of gate electrodes 12 of the transistors of the logic circuit sections 22 greater than the number of gate electrodes 12 of the transistors of the DRAM cell 21 are formed. Therefore, the electrode patterns which are lower layer patterns of the logic circuit sections 22 are dense, and the electrode patterns of the other DRAM cell 21 and so forth are formed non-densely.

Also, in such a DRAM-mixed logic circuit as described above, the surface of the oxide film 13 can be flattened uniformly and to a high degree as the DRAM-mixed logic circuit is processed through the two-stage polishing process.

While in the present embodiment, an oxide film of $SiO^2$ is used as the polishing object film, the present invention also can be applied also to oxide films of NSG (no doped SG), HDP (High Density Plasma), BPSG (Boron Doped PSG), TEOS (Tetraethyl orthosilicate) and so forth. The substrate polishing method of the present embodiment can be applied to the fabrication of semiconductor devices other than DRAM-mixed logic circuits, such as semiconductor devices of solid-state image pickup apparatuses of the CCD type and the CMOS type and liquid crystal panel substrates.

Now, a working example is described in detail. A CMP apparatus used in the present working example is a polishing apparatus of the rotary type by Ebara, AMAT or Tokyo Seimitsu, and a foamed polyurethane resin (NITTA HAAS, product name: IC1400) is used as the polishing pad. Further, as the slurries, cerium oxide based slurries (DANM by Asahi Glass, JSR by Hitachi Chemical) are used.

Also, in the present working example, the CMP apparatus used has a general configuration similar to that of the CMP apparatus described hereinabove with reference to FIG. 1. Therefore, the following description is given with reference to FIG. 1, while an overlapping description is omitted to avoid redundancy.

A wafer having a polishing object film is placed on the surface table 2 of such a CMP apparatus 1, as described above, through the polishing pad 3. At the first stage, the ceria slurry 4a having a slurry concentration of approximately 0.7% and a BET value of 15 to 30 m²/g (average particle size of 170 to 140 nm) is supplied at a flow rate of 200 cc/min from the slurry supplying section 5. Then, the polishing head 6 is pressed against the wafer and rotated. At this time, the speed of rotation of the surface table 2 is 100 rpm and the speed of rotation of the polishing head 6 is 107 rpm, and the surface table 2 and the polishing head 6 are rotated in the same direction. Further, the temperature at this time is 25 to 30° C. At this first stage, convexes of patterns having a high area ratio are polished intensively.

Then, at the second stage, the ceria slurry 4b having a BET value of approximately 5 to 50 m²/g (average particle size of 265 to 170 nm) is supplied at a flow rate of 200 cc/min from the slurry supplying section 5. Then, similarly as at the first stage, the polishing head 6 and the surface table 2 are rotated. At this second stage, convex portions of the electrode patterns which have a low area ratio are polished in a concentrated manner.

At the first and second stages, the polishing time is determined depending upon initial offsets and the film thickness prior to the polishing. A high planarization wafer is obtained in this manner.

According to the present working example, since a high planarization device can be obtained finally irrespective of the difference in the area ratio of electrodes, there is an effect that the accuracy at the succeeding steps is improved.

While in the embodiments and working examples described above the gate electrodes 12 are formed as lower layer patterns and the oxide film 13 formed on the upper face of the lower layer patterns is used as a polishing object film, it is otherwise possible to form the lower layer pattern as wiring lines, an element isolation portion or an insulating film different from an oxide film and apply the oxide film CMP method of the present invention similarly also to a CMP processing step of an oxide film of a polishing object film formed on an upper face of the lower layer patterns.

While a preferred embodiment of the present invention has been described using specific terms, such description is for illustrative purposes, and it is to be understood that changes and variations may be made without departing from the spirit or scope of the following claims.

What is claimed is:

1. A substrate polishing method, comprising step of
carrying out, using two or more different slurries formed from ceria abrasive grains having different Brunaure Emmett Teller (BET) values from each other, two or more stages of chemical-mechanical polishing processing of a polishing object oxide film on a substrate to flatten the polishing object film,
wherein the two or more stages of chemical-mechanical polishing processing include:
a first polishing processing step of using a slurry formed from ceria abrasive grains having a first BET value to polish the polishing object oxide film at a portion at which lower layer patterns are formed densely; and
a second polishing processing step of using another slurry formed from ceria abrasive grains having a second BET value lower than the first BET film to polish the polishing object oxide film at a portion at which lower layer patterns are formed non-densely,
wherein the first BET value is 15 to 30 $m^2/g$, and the second BET value is 5 to 10 $m^2/g$.

2. A substrate polishing method comprising the steps of:
polishing an object film using a slurry, said slurry having grains of a first average particle size; and thereafter,
polishing said object film using another slurry, said another slurry having grains of a second average particle size,
wherein said second average particle size is greater than said first average particle size,
wherein said grains of the second average particle size are ceria abrasive grains.

3. A substrate polishing method comprising the steps of:
polishing an object film using a slurry, said slurry having grains of a first average particle size; and thereafter,
polishing said object film using another slurry, said another slurry having grains of a second average particle size,
wherein said second average particle size is greater than said first average particle size,
wherein said grains of the first average particle size are ceria abrasive grains, said grains of the second average particle size being ceria abrasive grains.

* * * * *